United States Patent [19]
Cherng

[11] Patent Number: 5,837,577
[45] Date of Patent: Nov. 17, 1998

[54] METHOD FOR MAKING SELF-ALIGNED NODE CONTACTS TO BIT LINES FOR CAPACITOR-OVER-BIT-LINE STRUCTURES ON DYNAMIC RANDOM ACCESS MEMORY (DRAM) DEVICES

[75] Inventor: George Meng-Jaw Cherng, Hsinchu, Taiwan

[73] Assignee: Vanguard International Semiconductor Corporation, Hsin-Chu, Taiwan

[21] Appl. No.: 66,010

[22] Filed: Apr. 24, 1998

[51] Int. Cl.$^6$ .............................................. H01L 21/8242
[52] U.S. Cl. ............................................ 438/253; 438/396
[58] Field of Search ..................................... 438/253–356, 438/393–398

[56] References Cited

U.S. PATENT DOCUMENTS 5,346,844  9/1994  Cho et al. .
5,668,038  9/1997  Huang et al. .

*Primary Examiner*—Jey Tsai
*Attorney, Agent, or Firm*—George O. Saile; Stephen B. Ackerman

[57] ABSTRACT

A method for making memory cells having self-aligned node contacts to bit lines was achieved. After forming the array of FETs for the memory cells, a first insulating layer is deposited and planarized. A single masking step is used to concurrently etch bit lines and node contact openings for crown capacitors. A second polysilicon layer and a silicide layer are deposited to form a polycide layer which is specially patterned to form bit lines with portions of the polycide layer extending over the node contacts. A second insulating layer (e.g., BPSG) is deposited and openings are etched aligned over the node contacts to the polycide. The polycide is selectively etched in the openings to electrically isolate the individual bit lines and concurrently form self-aligned node contacts. A third insulating layer is deposited and etched back to form insulating sidewall liners on the bit lines. A third polysilicon layer is deposited and polished back to form an array of bottom electrodes in the openings for crown capacitors. An interdielectric layer and a fourth polysilicon layer are deposited, and the fourth polysilicon layer is patterned to complete the array of crown capacitors for the DRAM device.

29 Claims, 8 Drawing Sheets

FIG. 1 – Prior Art

FIG. 2 – Prior Art

METHOD FOR MAKING SELF-ALIGNED NODE CONTACTS TO BIT LINES FOR CAPACITOR-OVER-BIT-LINE STRUCTURES ON DYNAMIC RANDOM ACCESS MEMORY (DRAM) DEVICES

BACKGROUND OF THE INVENTION (1) Field of the Invention

This invention relates to an integrated circuit semiconductor device, and more particularly to a method for fabricating an array of memory cells for dynamic random access memory devices having self-aligned capacitor node contacts to bit lines. The method forms the bit line contact openings and node contact openings at the same time and then uses a novel patterned polycide layer to form the bit lines and the capacitor node contacts for the DRAM cells.

(2) Description of the Prior Art

The number and density of memory cells on the DRAM chip has dramatically increased in recent years. By the year 2000 the number of memory cells on a chip is expected to reach 1 Gigabit. This increase in circuit density has resulted from the downsizing of the individual semiconductor devices (FETS) and the resulting increase in device packing density. The reduction in device size is due in part to advances in high resolution photolithography and directional (anisotropic) plasma etching. In the non-self-aligned process of the prior art, the contact openings for the bit lines are made first, and the bit lines are formed. The openings for the capacitor node contacts are then made and alignment tolerances are required between the bit lines and the node contacts that limit the cell density. That is, without self-alignment techniques, the cell size must be increased in order to tolerate the misalignment error between the node contacts and the bit lines.

One method of the prior art to eliminate the alignment tolerances is to use a self-aligned contact (SAC) process, as depicted in the top view of FIG. 1 and in the schematic cross-sectional view of FIG. 2.

Shown in the top view of FIG. 1 is a portion of an array of memory cells on a substrate 10 having word lines 18 formed from a first polysilicon layer (or polycide layer). The word lines also extend over the active device areas, such as device area 8, and function as the FET gate electrodes for the DRAM access transistors. After forming the word lines 18, a first insulating layer 20, commonly referred to as an IPO layer (Inter-Polysilicon-Oxide layer) is deposited and contact openings 4 and 6 are concurrently etched to form respective bit line contacts 4 and the node contacts 6 for the capacitors. In the prior art process, a second polysilicon layer and a silicide layer are deposited to form a polycide layer, and a thick cap oxide layer is deposited. The cap oxide and polycide layer are then patterned to form the bit lines 24 having a cap oxide 26. The bit lines 24 are formed over the bit line contacts 4, while leaving portions of the second polysilicon layer in the node contact openings 6 to form the node contacts.

To better understand the prior art process, a schematic cross-sectional view through a portion 2—2' of the top view of FIG. 1 is shown in FIG. 2. The cross section includes two unit memory cells, each having a stacked capacitor, and sharing a common bit line via the bit line contact 4'. As shown in FIG. 2, a shallow trench isolation (STI) 12 is formed surrounding device areas 8. The polysilicon or polycide word lines 18 are formed next, and also form the FET gate electrodes 18' over a gate oxide 14 that is first grown on the device areas 8. Source/drain areas 17(N) are then formed adjacent to the gate electrodes 18' in the substrate 10, for example by ion implantation. The source/drain areas can be lightly doped N⁻ to minimize the leakage current. A thick insulating layer (IPO layer) 20 is deposited over the word lines 18, and then the capacitor node contact openings 6 and the bit line contacts 4 are etched in layer 20. Next a conductively doped second polysilicon layer 22 or polycide layer 24, which includes the silicide layer 23, and a thick cap oxide 26 are deposited and patterned to form the bit lines and concurrently leave portions of layer 22 in the capacitor node contact openings 6 to form the node contacts 6'. The cross section through 2—2' shows only the node contact 6' formed from the second polysilicon layer to the source/drain area 17(N).

After forming insulating sidewall spacers 28 on the bit lines, the crown capacitors are then formed by depositing a third polysilicon layer 30, which is patterned over the node contacts 6' to form the bottom electrodes for the crown capacitors. Unfortunately, for sub-micron structures using high-resolution photolithography, which requires a shallow depth of focus (DOF) during exposure, it is difficult to form a distortion-free photoresist mask for etching the bottom electrodes due to the rough topography created by the patterned bit lines 24 having the thick cap oxide 26. Also, because of the rough topography, it is difficult to pattern the third polysilicon layer to form the array of bottom electrodes using anisotropic plasma etching without leaving residue, such as polysilicon stringers or polysilicon sidewalls that can cause shorts between adjacent bottom electrodes.

Several methods for forming cylindrical or crown-shaped capacitors are described in the literature. More specifically, Byun et al. in U.S. Pat. No. 5,597,745, describes a method for making titanium nitride/titanium silicide bit lines for COB DRAM structures, but does not address the self-aligned node contact to bit line structure or process. Another method is described by Gonzales, U.S. Pat. No. 5,497,017, for making a high-density array of DRAM cells using a cross-point cell layout (memory cell is located at each intersection of the digit line (bit line) and the word line) and uses buried digit lines in the substrate. However, self-aligned node contacts to bit lines is not addressed. Jones, U.S. Pat. No. 5,405,796, teaches a method of making a capacitor for a memory cell for a DRAM device using an annular high permittivity dielectric material, but does not teach a method for self-aligning the node contacts to the bit lines.

Therefore there is still a need in the industry to provide a process that forms self-aligned node contacts to bit lines for capacitor-over-bit line (COB) structures for DRAM devices without the shortcomings cited above, while providing a cost-effective manufacturing process.

SUMMARY OF THE INVENTION

It is a principal object of the present invention to form an array of closely spaced dynamic random access memory (DRAM) cells having capacitor-over-bit line (COB) structures with node contacts self-aligned to the bit lines.

It is another object of the present invention to form these self-aligned node-contact-to-bit-line structures by using a specially patterned polycide layer to make bit lines with self-aligned node contacts.

In this invention the method for making an array of dynamic random access memory (DRAM) cells having capacitor node contacts self-aligned to bit lines begins by providing a semiconductor substrate. Typically the substrate is a P⁻ doped single-crystal silicon having a <100> crystallographic orientation. Device areas are provided by forming a relatively thick Field Oxide (FOX) that surrounds and electrically isolates each device area in and on the substrate. One conventional method of forming the field oxide areas is by a shallow trench isolation (STI) method, as commonly practiced in the industry. Briefly, the STI is formed by etching trenches in the field oxide areas on the substrate. The trenches are then filled with an insulating material and made planar with the substrate surface. Alternatively, the field oxide can be formed by the LOCal Oxidation of Silicon (LOCOS) method in which the substrate is selectively oxidized in the field oxide areas. The FETs are formed next by forming a thin gate oxide on the device areas, and then depositing a heavily $N^+$ doped first polysilicon layer which is patterned to form the gate electrodes on the device areas and concurrently form word lines over the field oxide areas. The gate electrodes can also be formed from a polycide layer (polysilicon/silicide) to improve electrical conductivity by forming a silicide on the first polysilicon layer prior to patterning. For submicron FET structures, lightly doped source/drain areas and insulating sidewall spacers can be included to improve the device characteristics (short-channel effects). Source/drain contact areas are now formed by ion implanting an N type dopant, such as phosphorus ions ($p^{31}$), adjacent to the FET gate electrodes. The dopant concentration can be adjusted to minimize leakage current. This completes the array of FETs used to form the array of switching transistors in the DRAM cells.

The method of making an array of bit lines having self-aligned capacitor node contacts continues by depositing a first insulating layer that is etched back or chemical/mechanically polished back to provide a planar surface. Conventional photolithographic techniques and anisotropic plasma etching are used to form openings in the first insulating layer and to concurrently form bit line contact openings and capacitor node contact openings to the source/drain contact areas of the FETs. A second polysilicon layer is deposited thereby filling the bit line contact openings and also filling the capacitor node contact openings. A refractory metal silicide layer is deposited on the second polysilicon layer to form a polycide layer. The polycide layer is then patterned to form an array of bit lines over the bit line contact openings while, by the method of this invention, portions of the polycide layer are left over the node contact openings between the bit lines. A relatively thick second insulating layer (cap oxide), preferably composed of a borophosphosilicate glass (BPSG), is deposited on the patterned polycide layer. Photolithographic techniques and anisotropic plasma etching are used to form an array of openings in the second insulating layer over the node contact openings. The openings in which the bottom electrodes for the crown capacitors will be formed, are etched selectively to the polycide layer to the polycide layer. The polycide layer exposed in the openings and over the node contacts is then removed by selective etching to electrically isolate adjacent bit lines while leaving portions of the second polysilicon layer in the node contact openings to form the self-aligned node contacts for the capacitors. A conformal third insulating layer is deposited over the substrate and extending into the openings, and is anisotropically etched back to form sidewall liners on the bit lines thereby electrically isolating the exposed portions of the bit lines. Next an in-situ conductively doped third polysilicon layer is deposited over the substrate and in the openings, and is chemical/mechanically polished (CMP) back to the second insulating layer to form an array of electrically isolated bottom electrodes for an array of crown capacitors. A thin interelectrode dielectric layer is formed on the bottom electrodes, and a conductively doped fourth polysilicon layer is deposited and patterned to form top electrodes to complete the array of DRAM cells.

BRIEF DESCRIPTION OF THE DRAWINGS

The objects and advantages of this invention are best understood with reference to the attached drawings in the figures and the embodiment that follows.

DESCRIPTION OF THE PREFERRED EMBODIMENT

Referencing now to FIGS. 3 through 11 and in keeping with the objects of this invention, a detailed embodiment is described for making memory cells for DRAM devices in which capacitor node contacts are self-aligned to bit lines. Although the process is described for making memory cells for DRAM devices having N-channel FETs as the access transistors, it should also be well understood by one skilled in the art that by including additional process steps, in addition to those described in this embodiment, other types of devices can be included on the DRAM chip. For example, by forming N-well regions in a P-doped substrate, P-channel FETs can also be provided from which Complementary Metal-Oxide-Semiconductor (CMOS) circuits can be formed, such as are required for the peripheral circuits on the DRAM chip.

Figure 1:
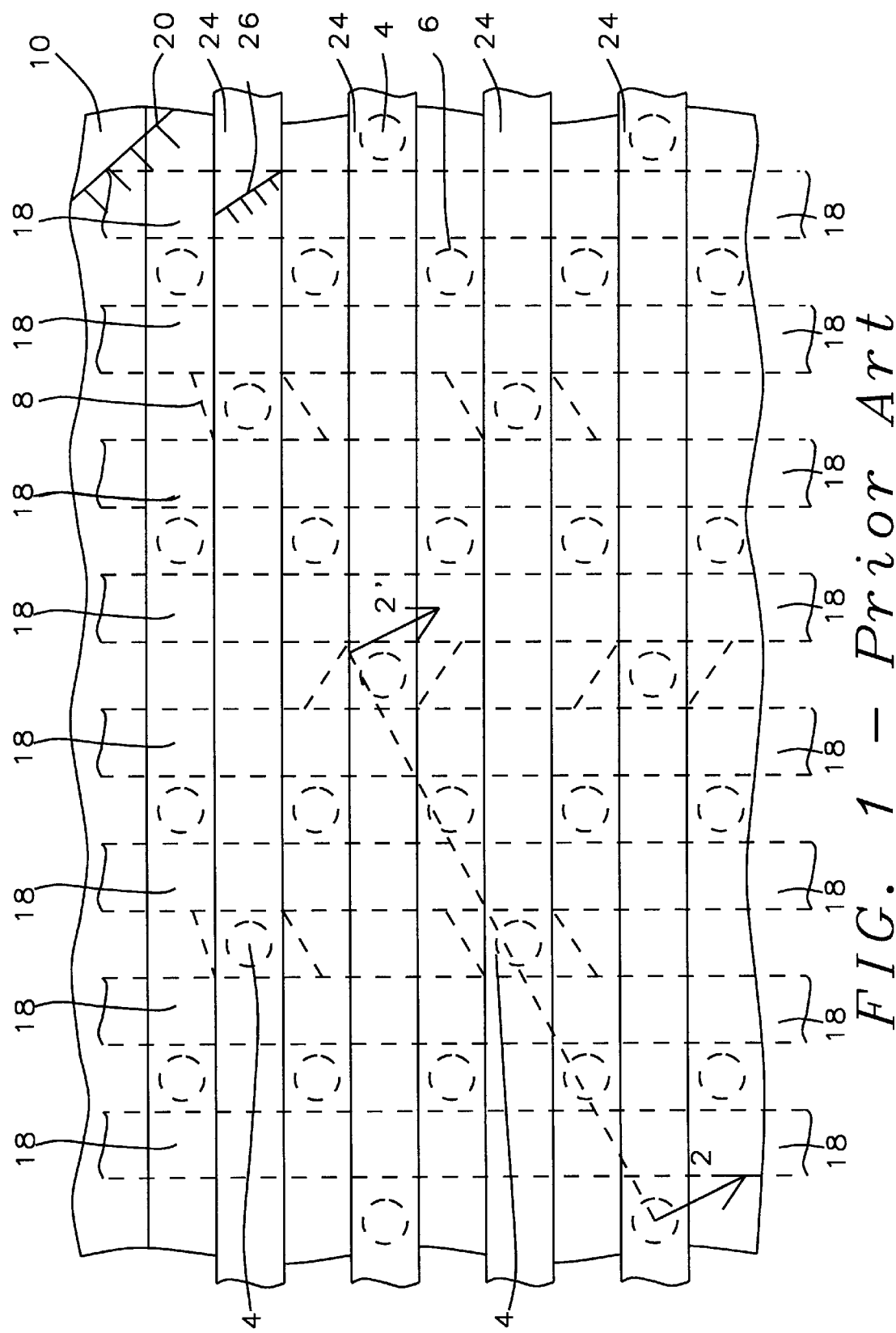
FIG. 1 is a schematic top view showing a portion of the memory cell area for a DRAM device by the prior art.
Figure 2:
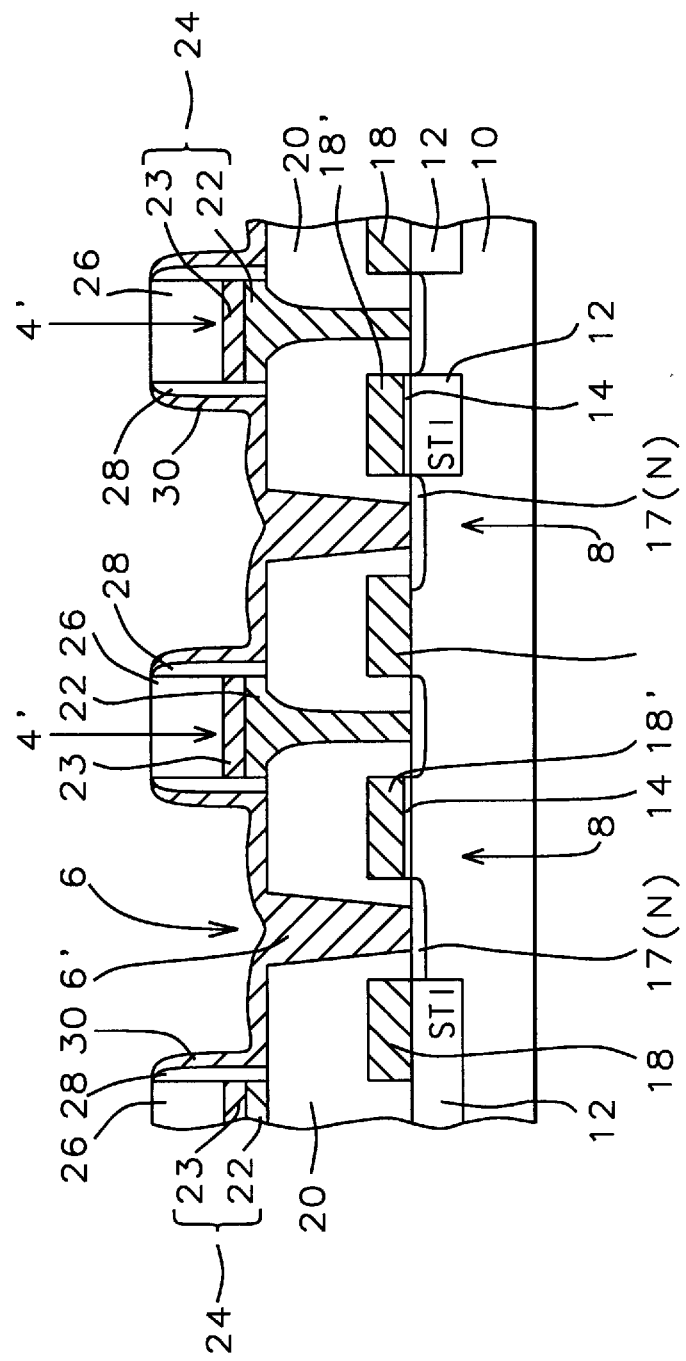
FIG. 2 is a schematic cross-sectional view through a portion of the memory cells shown in FIG. 1.
Figure 3:
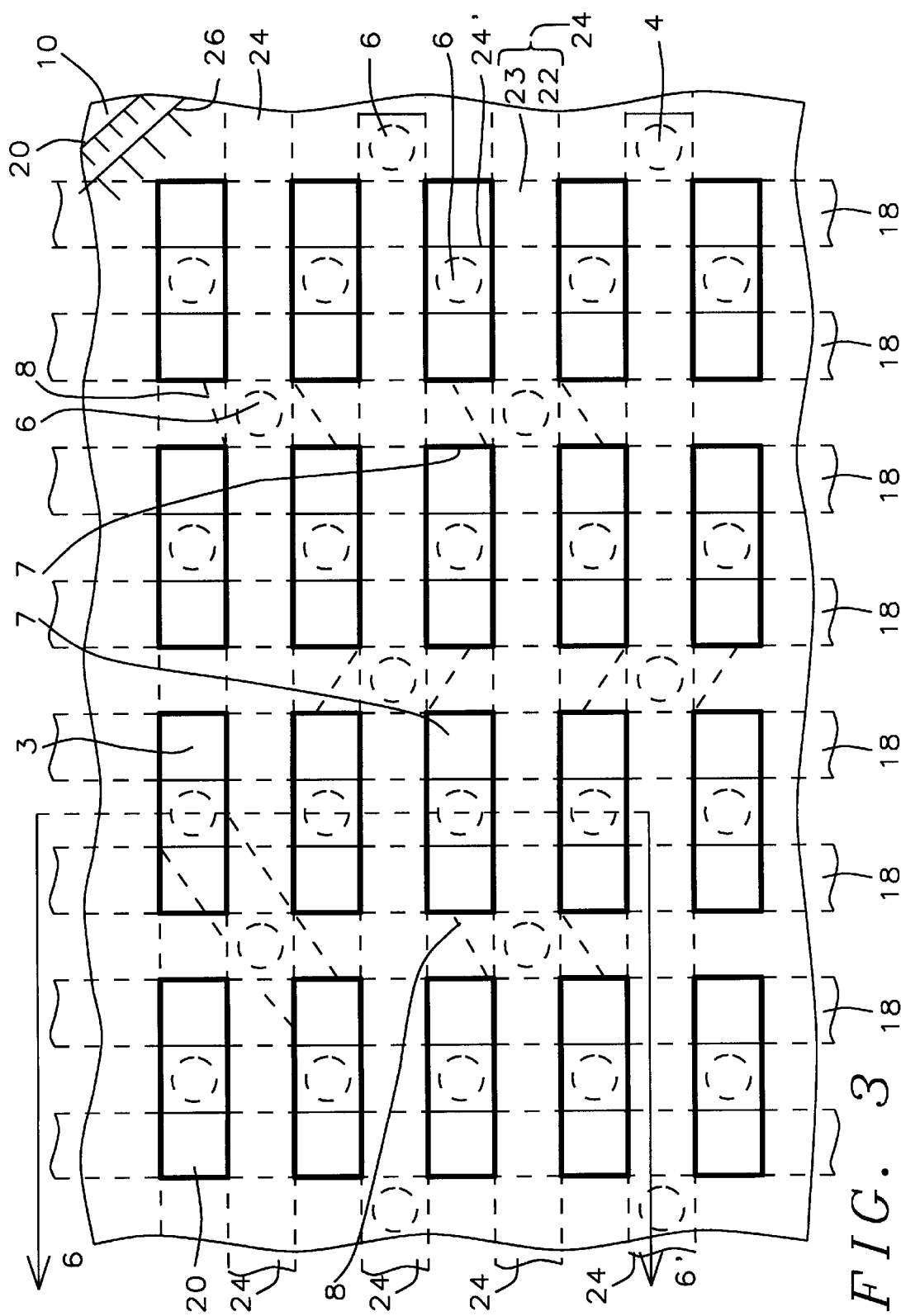
FIG. 3 is a schematic top view of a portion of the memory cell area for a DRAM device for the present invention up to and including a specially patterned polycide layer for the bit lines.
Figure 4:
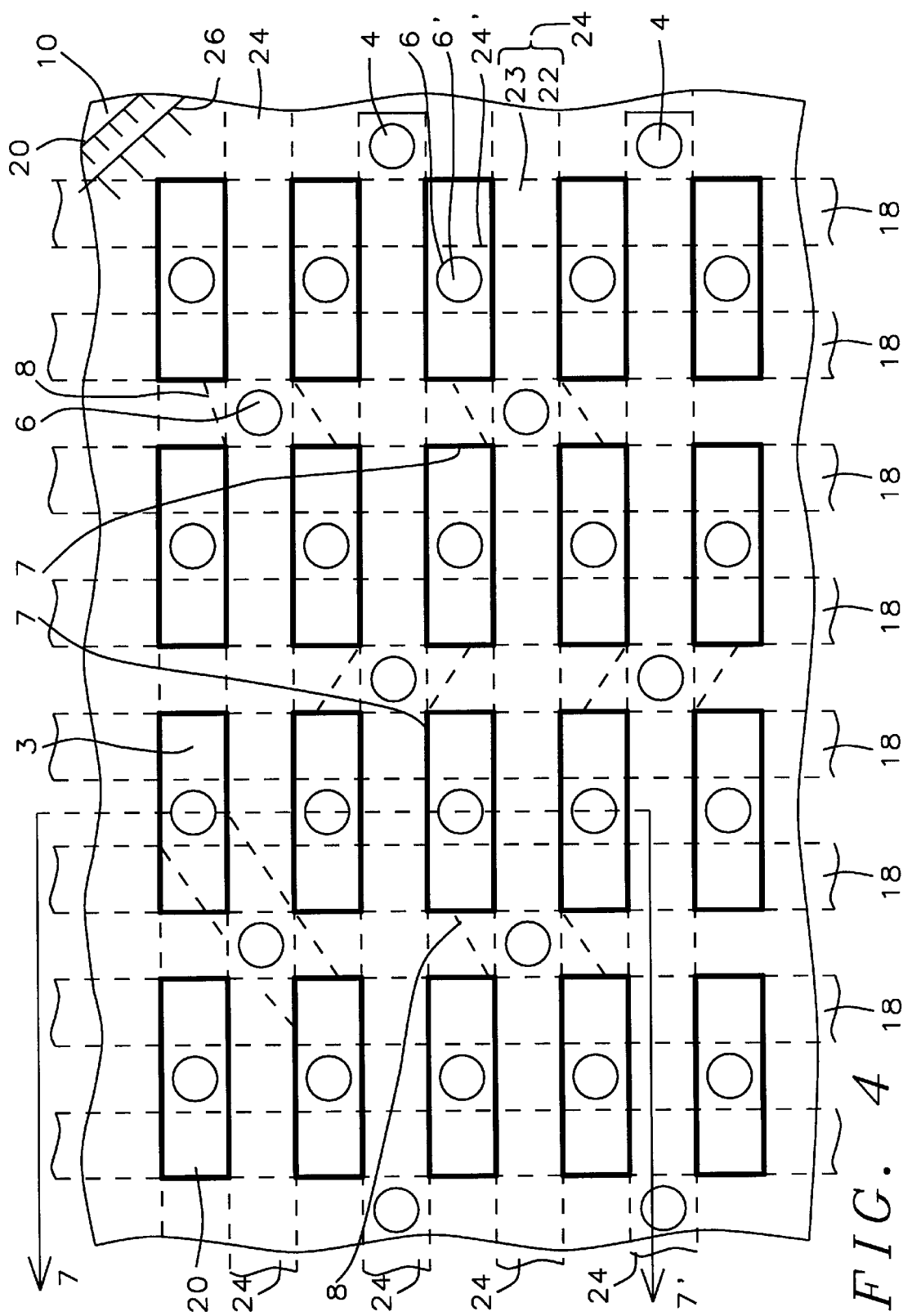
FIG. 4 is a schematic top view of a portion of the memory cell area for a DRAM device for the present invention after the specially patterned polycide layer is further etched through openings in a second insulating layer to complete the bit lines and provide the self-aligned capacitor node contacts.

FIGS. 3 and 4, respectively, show the top view of the current invention using the specially patterned polycide layer 24 having portions 24' over the node contact 6, and the process at a later process step in which the portions 24' are selectively removed to form the self-aligned node contacts 6 to bit line 24 while forming the COB structure. The method of achieving this structure is now described in detail with reference to the cross-sectional views in FIGS. 5–11.

Figure 5:
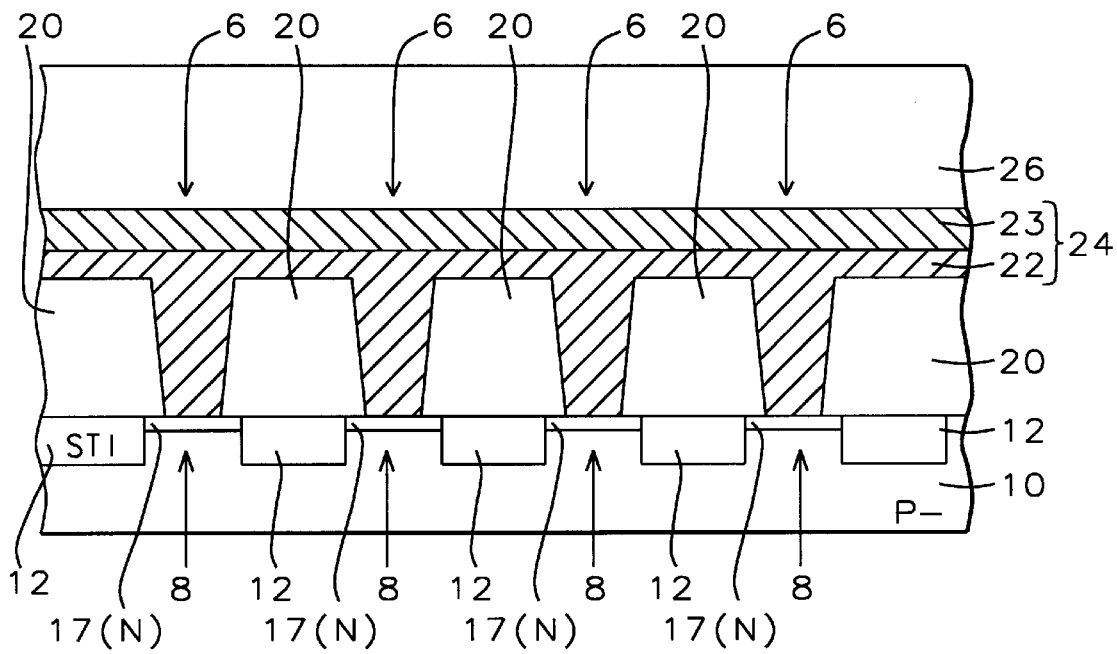
FIGS. 5 through 11 are schematic cross-sectional views showing the sequence of process steps for making the novel self-aligned capacitor node contacts to bit lines for a DRAM device with the capacitor-over-bit-line (COB) structure.

Referring now to FIG. 5, a cross section through section 5—5' of FIG. 3 is shown along a series of node contact openings 6. The method begins by providing a semiconductor substrate 10. Typically the substrate is a $P^-$ doped single-crystal silicon having a <100> crystallographic orientation. Field Oxide (FOX) regions 12 are formed surrounding and electrically isolating device areas 8 in and on the substrate 10. One conventional method of forming the field oxide regions is by using a shallow trench isolation (STI) method, as commonly practiced in the industry. Generally the STI is formed by etching trenches in the field oxide regions on the substrate to a depth of between about 2500 and 10000 Angstroms. After forming a thin thermal oxide in the trenches, the trenches are filled with an insulating material such as silicon oxide ($SiO_2$), and are made planar with the surface of the substrate 10, for example, by using a planarizing etchback or chemical/mechanical polishing (CMP). Alternatively, the field oxide can be formed by the LOCal Oxidation of Silicon (LOCOS) method in which the substrate is selectively oxidized in the field oxide regions using silicon nitride ($Si_3N_4$) as an oxidation barrier mask over the device areas.

Although the cross section in FIG. 5 does not depict the N-channel FETs, briefly the FETs are formed by growing a thin gate oxide of about 60 to 200 Angstroms on the device areas. The FET gate electrodes are formed next by depositing an $N^+$ doped first polysilicon layer 18, for example by low pressure chemical vapor deposition, and is typically deposited to a thickness of between about 500 and 2000 Angstroms. The first polysilicon layer is then patterned to form the gate electrodes over the active device areas 8, while concurrently forming word lines 18 on the substrate as shown in FIG. 3. Alternatively, a polycide (polysilicon/silicide) layer can be used to improve electrical conductivity by forming a silicide on the first polysilicon layer prior to patterning. Also, for sub-micron FET structures, lightly doped source/drain areas and insulating sidewall spacers can be included to improve the device characteristics (short-channel effects), but are not depicted in the drawings. Source/drain contact areas 17(N) are now formed by ion implanting an N type dopant, such as $p^{31}$, adjacent to the FET gate electrodes to complete the FETs. A portion of the contact 17(N) for the capacitor node contact is shown in FIG. 5. Also the contacts 17(N) can be lightly doped to lower the leakage current.

A first insulating layer 20 composed of $SiO_2$ is deposited over the word lines, for example by LPCVD using tetraethosiloxane (TEOS), and to a thickness of between about 3000 and 15000 Angstroms. Layer 20 is then planarized, for example, by using chemical/mechanical polishing (CMP). Alternatively, spin-on glass or photoresist can be used with a conventional etchback technique.

Still referring to FIG. 5, conventional photolithographic techniques and anisotropic plasma etching are used to concurrently etch bit line contact openings 4 and capacitor node contact openings 6 to the source/drain contact areas 17(N) in the first insulating layer 20, as shown in FIGS. 3 and 5. Only the node contact openings 6 are shown in cross section in FIG. 5.

Still referring to FIG. 5, the specially patterned polycide layer 24 in FIG. 3 is formed next, as follows. A second polysilicon layer 22 is deposited thereby filling the bit line contact openings 4 (FIG. 3) and also filling the capacitor node contact openings 6. The second polysilicon is preferably deposited by LPCVD using silane ($SiH_4$) and is in-situ doped $N^+$ using a dopant gas such as phosphine ($PH_3$) to a dopant concentration of about 1.0 E 19 to 1.0 E 21 atoms/$cm^3$. Layer 22 is deposited to a thickness sufficient to fill openings 4 and 6, but preferably to a thickness of between about 500 and 5000 Angstroms. A refractory metal silicide layer 23 is deposited on the second polysilicon layer 22 to form a polycide layer 24. For example, the preferred silicide is a tungsten silicide ($WSi_2$), and can be deposited by LPCVD using a reactant gas of tungsten hexafluoride ($WF_6$) and $SiH_4$, and is deposited to a thickness of about 500 to 2000 Angstroms.

Now, by the method of this invention, the polycide layer 24 is patterned to form an array of bit lines over the bit line contact openings 4 while leaving portions 24' of the polycide layer 24 over the node contact openings 6 between the bit lines 24, as shown in FIG. 3.

Still referring to FIG. 5, a relatively thick second insulating layer (cap oxide) 26 is deposited on the patterned polycide layer 24. Layer 26 is preferably composed of a borophosphosilicate glass (BPSG), and can be deposited by LPCVD using TEOS and a dopant gas such as diborane hydride ($B_2H_6$) and phosphine ($PH_3$). The BPSG layer 26 is deposited to a preferred thickness of between about 2000 and 20000 Angstroms, and is then chemical/mechanically polished back to form a planar surface.

Figure 6:
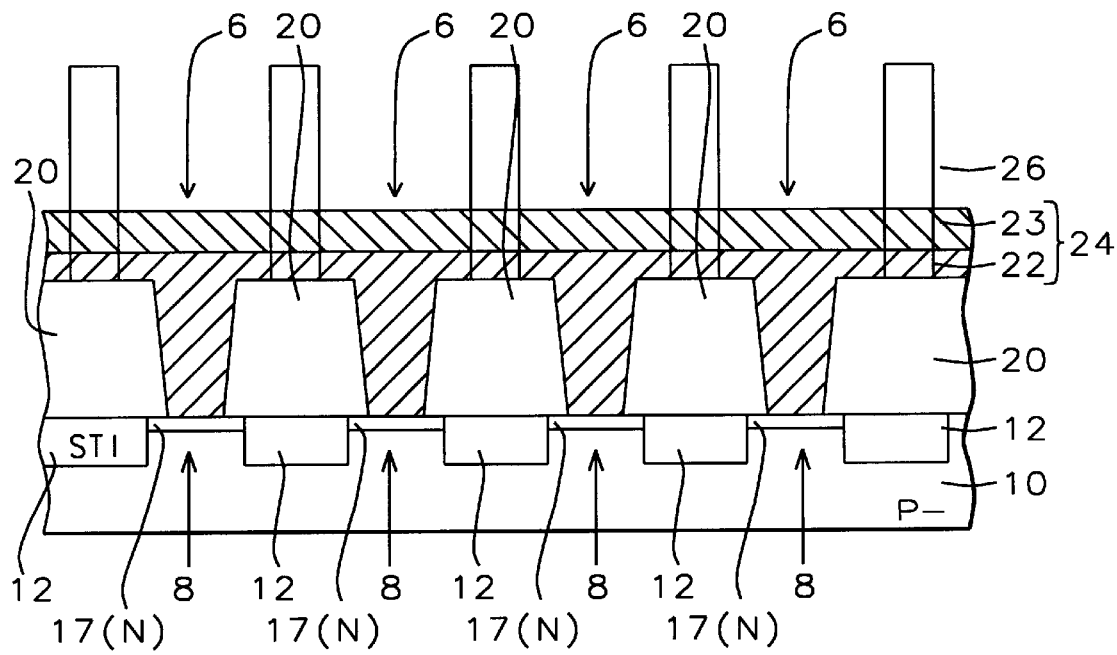

Referring now to FIG. 6, photolithographic techniques and anisotropic plasma etching are used to etch an array of openings 7 to the polycide 24' in which the bottom electrodes for the crown capacitors are later made. The openings 7 are etched in the second insulating layer 26 aligned over the node contact openings 6. The etching can be carried out using reactive ion etching (RIE) or high-density plasma (HDP) etching using a gas mixture which etches the BPSG 26 selectively to the polycide 24', using, for example, a gas mixture of carbon tetrafluoride ($CF_4$) and hydrogen ($H_2$) or trifluoromethane ($CHF_3$), and having an etch-rate selectivity of oxide to polycide of about 25:1. The polycide layer 24 also serves as an excellent etch endpoint detect layer to prevent overetching into the underlying oxide layer 20 exposed in the openings 7 adjacent to the polycide 24'.

Figure 7:
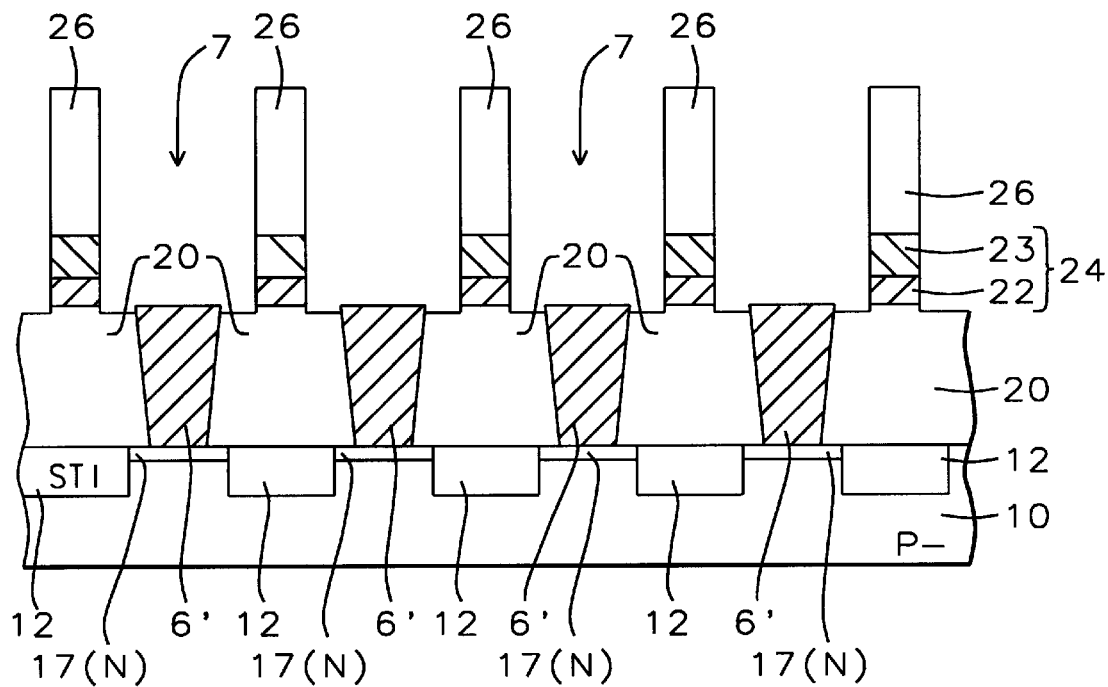

Referring now to FIG. 7, the polycide 24' is then selectively etched to the insulating layer 20 in the openings 7 over the node contacts openings 6. Two adjacent openings 7 of the array of openings are indicated in FIG. 3 separated by portions of the planar insulating layer 26. Preferably the polycide is etched using RIE and an etchant gas containing chlorine ($Cl_2$). The oxide layer 20 provides an excellent etch stop layer, for example, having an etchrate ratio of polycide to oxide of about 25:1. Portions of the polysilicon layer 22 are left in the node contact openings 6 to form the capacitor node contacts 6'. The polycide etching also electrically isolates adjacent bit lines, and therefore providing node contacts 6' that are self-aligned to the bit lines 24, as shown in FIG. 7 and in the top view of FIG. 4.

Figure 8:
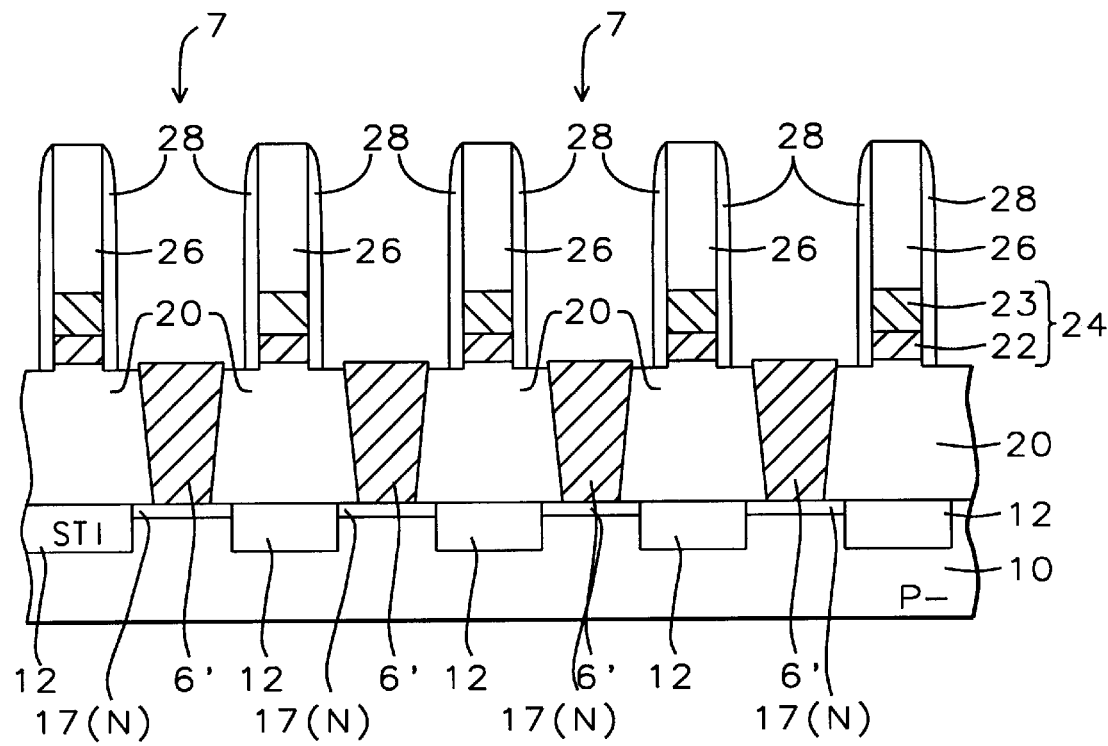

Referring now to FIG. 8, a conformal third insulating layer 28 is deposited on the substrate and extending into the openings 7. Layer 28 is preferably a $SiO_2$ deposited by LPCVD using a reactant gas such as TEOS. Alternatively layer 28 can be silicon nitride ($Si_3N_4$) deposited by LPCVD. Layer 28 is deposited to a preferred thickness of between about 100 and 1000 Angstroms. Third insulating layer 28 is then anisotropically plasma etched back to form sidewall liners 28 to electrically isolate the exposed portions of the bit lines 24 in the openings 7 from the node contacts 6'.

Figure 9:
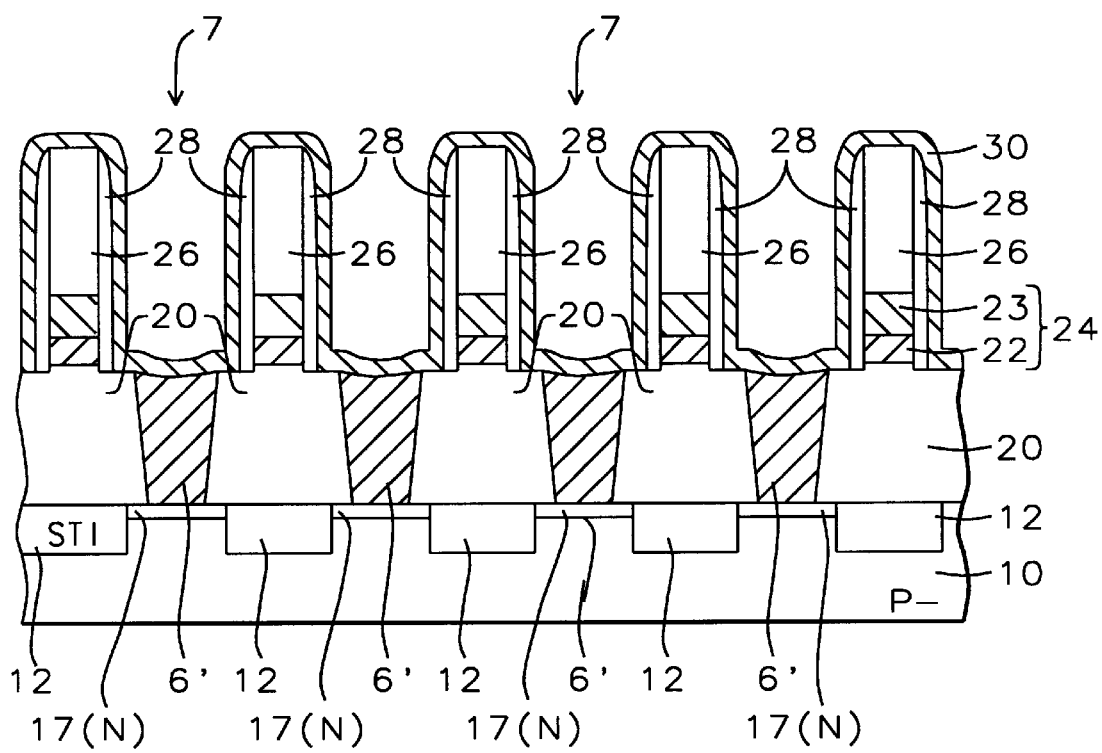

Referring to FIG. 9, the bottom electrodes for the crown capacitor are formed by depositing an $N^+$ doped third polysilicon layer 30 over the substrate and in the openings 7. Layer 30 is deposited by LPCVD using $SiH_4$ and is conductively $N^+$ doped with phosphorus to a concentration of between about 1.0 E 19 and 1.0 E 21 atoms/$cm^3$. Third polysilicon layer 30 and is deposited to a thickness of between about 200 and 1000 Angstroms.

Figure 10:
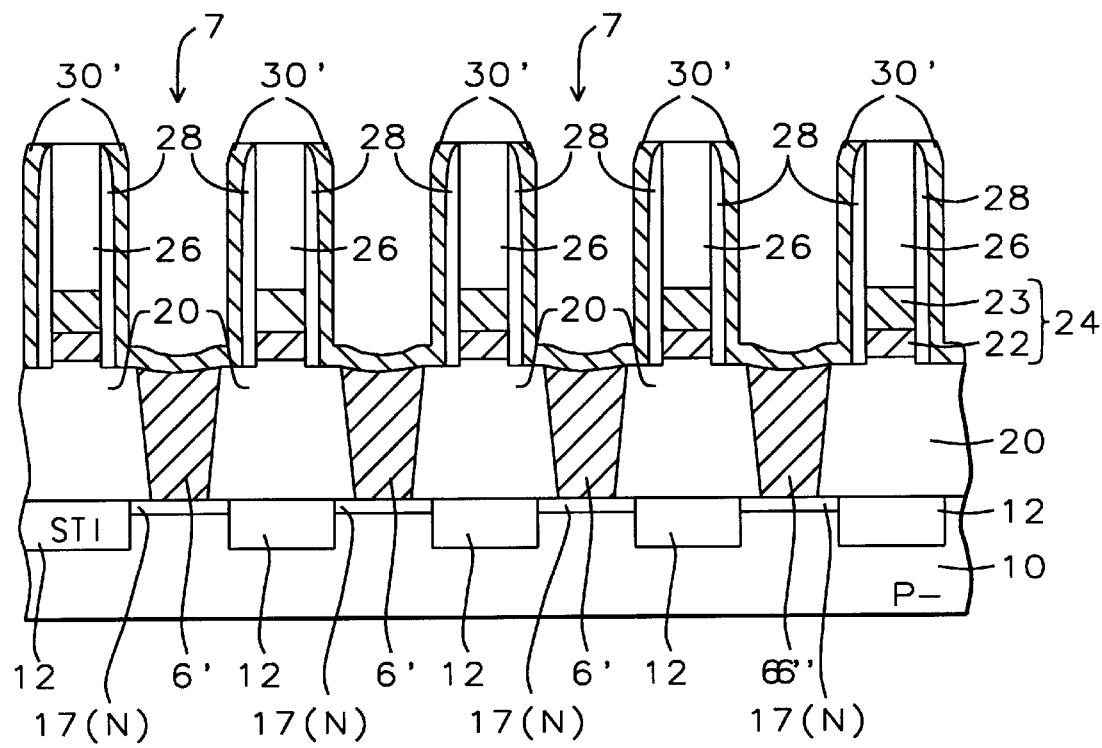

Referring to FIG. 10, the polysilicon layer 30 is then chemical/mechanically polish (CMP) back to the planar surface of the second insulating layer 26 to form an array of electrically isolated bottom electrodes 30' for an array of crown capacitors in the openings 7. This CMP back process of this invention to form the array of bottom electrodes avoids the problem associated with etching over a rough topography to form an array of bottom electrodes, as described in the prior art.

Figure 11:
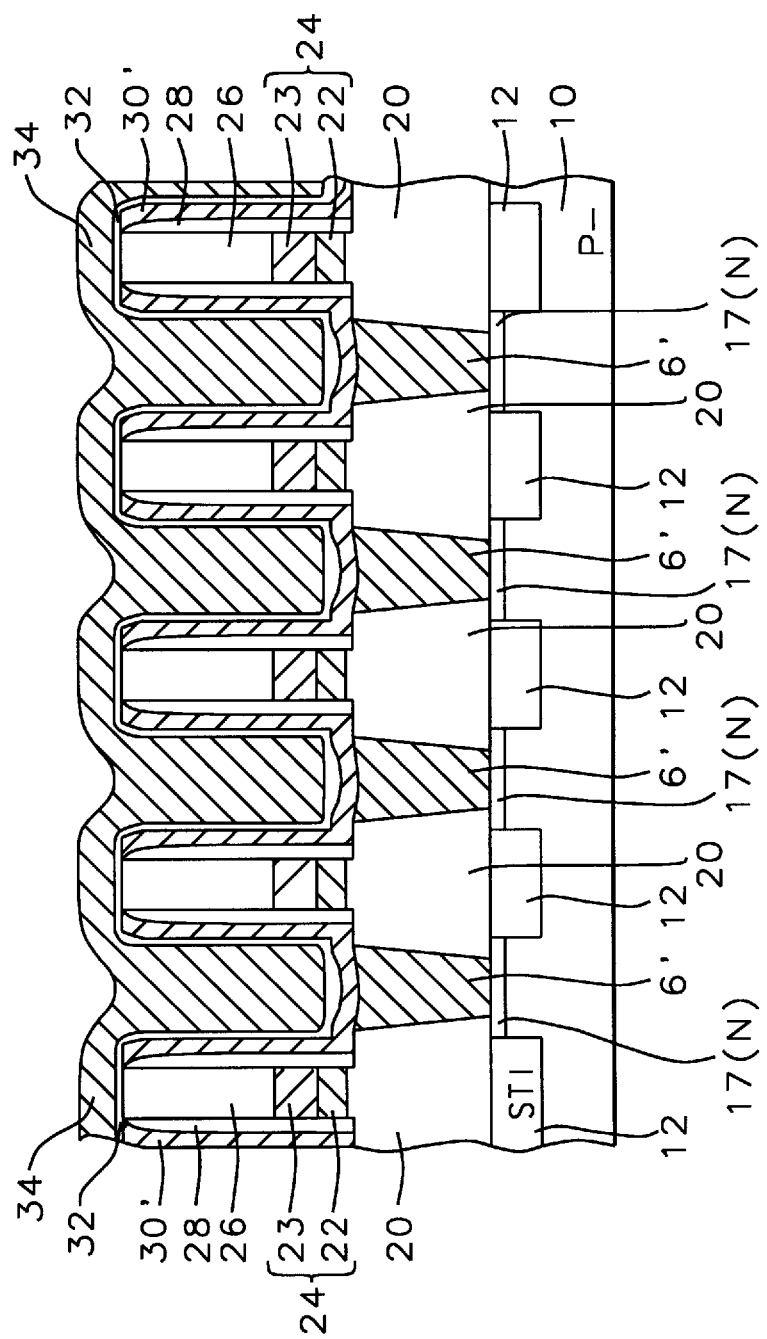

Next, referring to FIG. 11, a thin interelectrode dielectric layer 32 is deposited on the bottom electrodes 30'. For example, layer 32 can be a silicon oxide-silicon nitride-silicon oxide (ONO). Layer 32 can be formed by growing a thin silicon oxide layer, depositing a silicon nitride layer by LPCVD, and then converting the top surface of the nitride layer to a silicon oxide. In addition, the bottom electrodes formed from polysilicon layer 30 can be roughened to further increase the capacitance, for example, by subjecting layer 32 to a phosphoric acid solution etch. Alternatively, the interelectrode dielectric layer can be composed of a more exotic dielectric layer, such as tantalum pentoxide ($Ta_2O_5$) having a higher dielectric constant. Preferably the thickness of layer 32 is between about 30 and 100 Angstroms.

The array of crown capacitors is now completed by depositing a heavily $N^+$ doped blanket fourth polysilicon layer 34. Preferably layer 34 is deposited by LPCVD using, for example, $SiH_4$ as the reactant gas, and is doped with phosphorus by either ion implantation or by in-situ doping. Preferably the dopant concentration is between about 1.0 E 20 and 1.0 E 21 atoms/$cm^3$. Layer 34 is deposited to a thickness of between about 250 and 1000 Angstroms. Layer 34 is then patterned using conventional photolithographic techniques and anisotropic plasma etching to form the top electrodes 34 over the interelectrode dielectric layer 32.

While the invention has been particularly shown and described with reference to the preferred embodiment thereof, it will be understood by those skilled in the art that various changes in form and details may be made without departing from the spirit and scope of the invention.

What is claimed is:

1. A method for making an array of dynamic random access memory (DRAM) cells having capacitor node contacts self-aligned to bit lines comprising the steps of:

providing a semiconductor substrate having device areas, and further providing semiconductor devices from a patterned first polysilicon layer and having contact areas for said semiconductor devices;

depositing a first insulating layer having a planar surface;

anisotropically etching openings in said first insulating layer to said contact areas and thereby forming concurrently bit line contact openings and capacitor node contact openings for said semiconductor devices;

depositing a second polysilicon layer thereby filling said bit line contact openings and further filling said capacitor node contact openings to form node contacts;

depositing a refractory metal silicide layer on said second polysilicon layer thereby forming a polycide layer;

patterning said polycide layer to form an array of bit lines over said bit line contact openings and leaving portions of said polycide layer between said bit lines over said node contact openings;

depositing a second insulating layer on said polycide layer;

etching openings aligned over said node contact openings in said second insulating layer to said polycide layer and further etching said polycide layer over said node contacts to electrically isolate adjacent said bit lines from each other;

depositing a third insulating layer and anisotropically etching back to form sidewall liners on said bit lines thereby isolating said bit lines from said node contacts;

depositing a third polysilicon layer over said substrate in said openings in said second insulating layer;

chemical/mechanically polishing back said third polysilicon layer to said second insulating layer thereby forming bottom electrodes for an array of crown capacitors in said openings in said second insulating layer;

forming an interelectrode dielectric layer on said bottom electrodes;

depositing and patterning a fourth polysilicon layer to form top electrodes and thereby completing said array of DRAM cells.

2. The method of claim 1, wherein said first polysilicon layer is conductively doped and has a thickness of between about 500 and 2000 Angstroms.

3. The method of claim 1, wherein said first insulating layer is silicon oxide deposited by chemical vapor deposition (CVD) to a thickness of between about 1000 and 5000 Angstroms.

4. The method of claim 1, wherein said first insulating layer is planarized by chemical/mechanical polishing (CMP).

5. The method of claim 1, wherein said second polysilicon layer is conductively doped and has a thickness of between about 500 and 5000 Angstroms.

6. The method of claim 1, wherein said silicide layer is composed of tungsten silicide having a thickness of between about 500 and 2000 Angstroms.

7. The method of claim 1, wherein said second insulating layer is a borophosphosilicate glass (BPSG) deposited to a thickness of between about 2000 and 20000 Angstroms.

8. The method of claim 1, wherein said openings in said second insulating layer over said node contact openings are etched using anisotropic plasma etching.

9. The method of claim 1, wherein said polycide layer over said node contacts is anisotropically plasma etched to the surface of said first insulating layer while leaving portions of said second polysilicon layer in said node contact openings.

10. The method of claim 1, wherein said third insulating is silicon nitride deposited to a thickness of between about 100 and 1000 Angstroms.

11. The method of claim 1, wherein said third insulating is silicon oxide deposited to a thickness of between about 200 and 1000 Angstroms.

12. The method of claim 1, wherein said third polysilicon layer is conductively doped and deposited to a thickness of between about 200 and 1000 Angstroms.

13. The method of claim 1, wherein said interelectrode dielectric layer is composed of a silicon oxide-silicon nitride-silicon oxide (ONO) and has an effective thickness of between about 30 and 70 Angstroms.

14. The method of claim 1, wherein said fourth polysilicon layer is conductively doped and deposited to a thickness of between about 250 and 1000 Angstroms.

15. The method of claim 1, wherein said semiconductor devices are metal-oxide-silicon field effect transistors (MOSFETs).

16. A method for making an array of dynamic random access memory (DRAM) cells having capacitor node contacts self-aligned to bit lines comprising the steps of:

providing a semiconductor substrate having device areas surrounded and electrically isolated from each other by field oxide areas, and further providing field effect transistors having gate electrodes formed from a patterned first polysilicon layer and having source/drain contact areas adjacent to said gate electrodes in said device areas;

depositing a first insulating layer having a planar surface;

anisotropically etching openings in said first insulating layer to said source/drain contact areas and thereby forming concurrently bit line contact openings and capacitor node contact openings for said field effect transistors;

depositing a second polysilicon layer thereby filling said bit line contact openings and further filling said capacitor node contact openings to form node contacts;

depositing a refractory metal silicide layer on said second polysilicon layer thereby forming a polycide layer;

patterning said polycide layer to form an array of bit lines over said bit line contact openings and leaving portions of said polycide layer between said bit lines over said node contact openings;

depositing a second insulating layer on said polycide layer;

etching openings aligned over said node contact openings in said second insulating layer to said polycide layer and further etching said polycide layer over said node contacts to electrically isolate adjacent said bit lines from each other;

depositing a third insulating layer and anisotropically etching back to form sidewall liners on said bit lines thereby isolating said bit lines from said node contacts;

depositing a third polysilicon layer over said substrate in said openings in said second insulating layer;

chemical/mechanically polishing back said third polysilicon layer to said second insulating layer thereby forming bottom electrodes for an array of crown capacitors in said openings in said second insulating layer;

forming an interelectrode dielectric layer on said bottom electrodes;

depositing and patterning a fourth polysilicon layer to form top electrodes and thereby completing said array of DRAM cells.

17. The method of claim 16, wherein said first polysilicon layer is conductively doped and has a thickness of between about 500 and 2000 Angstroms.

18. The method of claim 16, wherein said first insulating layer is silicon oxide deposited by chemical vapor deposition (CVD) to a thickness of between about 1000 and 5000 Angstroms.

19. The method of claim 16, wherein said first insulating layer is planarized using a spin-on glass and conventional etchback techniques.

20. The method of claim 16, wherein said second polysilicon layer is conductively doped and has a thickness of between about 500 and 5000 Angstroms.

21. The method of claim 16, wherein said silicide layer is composed of tungsten silicide having a thickness of between about 500 and 2000 Angstroms.

22. The method of claim 16, wherein said second insulating layer is a borophosphosilicate glass (BPSG) deposited to a thickness of between about 2000 and 20000 Angstroms.

23. The method of claim 16, wherein said openings in said second insulating layer over said node contact openings are etched using anisotropic plasma etching.

24. The method of claim 16, wherein said polycide layer over said node contacts is anisotropically plasma etched to the surface of said first insulating layer while leaving portions of said second polysilicon layer in said node contact openings.

25. The method of claim 16, wherein said third insulating is silicon nitride deposited to a thickness of between about 100 and 1000 Angstroms.

26. The method of claim 16, wherein said third insulating is silicon oxide deposited to a thickness of between about 200 and 1000 Angstroms.

27. The method of claim 16, wherein said third polysilicon layer is conductively doped and deposited to a thickness of between about 200 and 1000 Angstroms.

28. The method of claim 16, wherein said interelectrode dielectric layer is composed of a silicon oxide-silicon nitride-silicon oxide (ONO) and has an effective thickness of between about 30 and 70 Angstroms.

29. The method of claim 16, wherein said fourth polysilicon layer is conductively doped and deposited to a thickness of between about 250 and 1000 Angstroms.

* * * * *